US008560986B2

(12) United States Patent
Parizy

(10) Patent No.: US 8,560,986 B2
(45) Date of Patent: Oct. 15, 2013

(54) COMPUTER PRODUCT, APPARATUS, AND METHOD FOR CORRECTING ASSERTION

(75) Inventor: Matthieu Parizy, Meguro (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/462,948

(22) Filed: May 3, 2012

(65) Prior Publication Data

US 2013/0055180 A1 Feb. 28, 2013

(30) Foreign Application Priority Data

Aug. 29, 2011 (JP) ................................ 2011-186547

(51) Int. Cl.
*G06F 17/50* (2006.01)
(52) U.S. Cl.
USPC ............ 716/106; 716/100; 716/101; 716/136
(58) Field of Classification Search
USPC .................................. 716/100–101, 106, 136
See application file for complete search history.

(56) References Cited

U.S. PATENT DOCUMENTS

| 7,231,627 | B2 * | 6/2007 | Fong et al. .................... 716/102 |
| 7,404,160 | B2 * | 7/2008 | Piper et al. .................... 716/106 |
| 2006/0085774 | A1 * | 4/2006 | Moorby ............................ 716/5 |
| 2006/0259884 | A1 * | 11/2006 | Fong et al. ........................ 716/5 |
| 2007/0226666 | A1 * | 9/2007 | Ganai et al. ...................... 716/5 |
| 2007/0294651 | A1 * | 12/2007 | Tsai et al. ........................ 716/5 |
| 2008/0082946 | A1 * | 4/2008 | Zilic et al. ........................ 716/5 |
| 2009/0125290 | A1 * | 5/2009 | Chatterjee et al. .............. 703/13 |
| 2009/0204931 | A1 * | 8/2009 | Lim et al. ......................... 716/5 |
| 2009/0293026 | A1 * | 11/2009 | Tsuchiya ......................... 716/5 |
| 2010/0169853 | A1 * | 7/2010 | Jain et al. ......................... 716/5 |
| 2011/0161898 | A1 * | 6/2011 | Chauhdry et al. ............. 716/103 |
| 2013/0019216 | A1 * | 1/2013 | Vasudevan et al. ........... 716/106 |

FOREIGN PATENT DOCUMENTS

| JP | 2002-149440 A | 5/2002 |
| JP | 2008-158696 A | 7/2008 |

* cited by examiner

*Primary Examiner* — Stacy Whitmore
(74) *Attorney, Agent, or Firm* — Fujitsu Patent Center

(57) ABSTRACT

A computer-readable medium stores therein a correcting program that causes a computer to execute a process. The process includes decomposing a correction subject assertion, based on a logical structure of the correction subject assertion; detecting by simulation of a circuit-under-test and from among properties obtained by decomposing the correction subject assertion, a property that has failed; concatenating to the detected property and by logical OR, a failure source; and outputting the concatenated property.

6 Claims, 11 Drawing Sheets

FIG.3

| ASSERTION ID | FAILURE COUNT | SELECT |
|---|---|---|
| A5 | 20 | ☑ |
| A7 | 12 | ☑ |
| A4 | 3 | ☑ |
| A2 | 2 | ☑ |
| A1 | 1 | ☐ |
| A3 | 0 | ☐ |
| A6 | 0 | ☐ |
| ⋮ | ⋮ | ⋮ |

VALIDATE

FIG.5

RE-SIMULATION RESULTS 500

| PROPERTY ID | FAILURE COUNT | SOURCE OF FAILURE |
|---|---|---|
| p1 | 13 | X |
| p2 | 7 | E==3 |
| p3 | 0 | - |
| p4 | 0 | - |
| p5 | 3 | G==J |
| ⋮ | ⋮ | ⋮ |

COMPUTER PRODUCT, APPARATUS, AND
METHOD FOR CORRECTING ASSERTION

CROSS REFERENCE TO RELATED APPLICATIONS

This application is based upon and claims the benefit of priority of the prior Japanese Patent Application No. 2011-186547, filed on Aug. 29, 2011, the entire contents of which are incorporated herein by reference.

FIELD

The embodiment discussed herein is related to a computer product, a correcting apparatus, and a correcting method that correct information.

BACKGROUND

Conventionally, technology has been disclosed that records, as a history of simulation results, "the number of times failure occurs" and "information related to the time at which failure occurs" to identify assertions that have failed and assertions that are valid. Further, technology has been disclosed that when an error occurs during simulation, analyzes with which test pattern the error occurred and displays the pattern. For examples, refer to Japanese Laid-Open Patent Publication Nos. 2008-158696 and 2002-149440.

If the verification engineer does not sufficiently understand or misunderstands the specifications from which the assertions are created, the created assertions may include errors. If such an assertion is used to simulate a circuit-under-test and the assertion fails, it cannot be determined whether the assertion is correct and failed or whether the assertion includes an error and consequently failed. Further, simulation results due to failure appear in many ways depending on the contents of the assertion.

Therefore, the verification engineer again analyzes the specifications, or the verification engineer and the design engineer again confirm the specifications, and then the assertions have to be corrected. As a result, a problem arises in that correction work for the assertions is time consuming.

Further, with the technology above, since processing is performed under the assumption that the assertions are correct, a problem arises in that assertion errors based on insufficient understanding or a misunderstanding of the specifications are difficult to identify.

SUMMARY

According to an aspect of an embodiment, a computer-readable medium stores therein a correcting program that causes a computer to execute a process. The process includes decomposing a correction subject assertion, based on a logical structure of the correction subject assertion; detecting by simulation of a circuit-under-test and from among properties obtained by decomposing the correction subject assertion, a property that has failed; concatenating to the detected property and by logical OR, a failure source; and outputting the concatenated property.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a schematic depicting an example of a selection screen for simulation results 200.

FIG. 5 is a schematic of re-simulation results 500 of a circuit-under-test DUT re-simulated using properties decomposed from a correction subject.

DESCRIPTION OF EMBODIMENTS

Preferred embodiments of the present invention will be explained with reference to the accompanying drawings.

In the present embodiment, an assertion that fails under simulation of a circuit-under-test is regarded as a correction subject. Here, an assertion is information describing behavior that must be achieved by the design of a circuit-under-test. Taking System Verilog Assertion (SVA) as an example, if "A==B" is described as a property, verification that variable/signal A is always the same as variable/signal B is required.

Further, if "A|→B" is described, verification that when event A occurs, event B occurs is required. If "A&&B" is described as a property, verification that bit value A and bit value B are always sets as "1" is required.

When assertions are valid, it is known that the circuit-under-test behaves according to the specifications. On the other hand, if assertions fail, it is known that the circuit-under-test does not behave according to the specifications. In this case, if the verification engineer does not sufficiently understand or misunderstands the specifications of the circuit-under-test and an assertion fails, the verification engineer cannot determine whether the failure is consequent to operation that is not in the specifications or despite operation according to the specifications, the failure is consequent to an error in the assertion. Thus, in the present embodiment, for assertions that fail, the factor (variable, signal, bit value) causing the failure is added to the failed assertion by logical sum.

Assertion description is often complicated and/or redundant. Therefore, the verification engineer has to determine which a part of a failed assertion has to be corrected. Consequently, in the present embodiment, prior to simulation, the assertions are decomposed. Furthermore, in the present embodiment, the resulting decomposed description is referred to as "property". A property is a simple expression such as "A==B", "A|→B", and "A&&B" above. Therefore, correction work efficiency is facilitated by correcting properties that fail during simulation and by presenting correction candidates.

Figure 1:
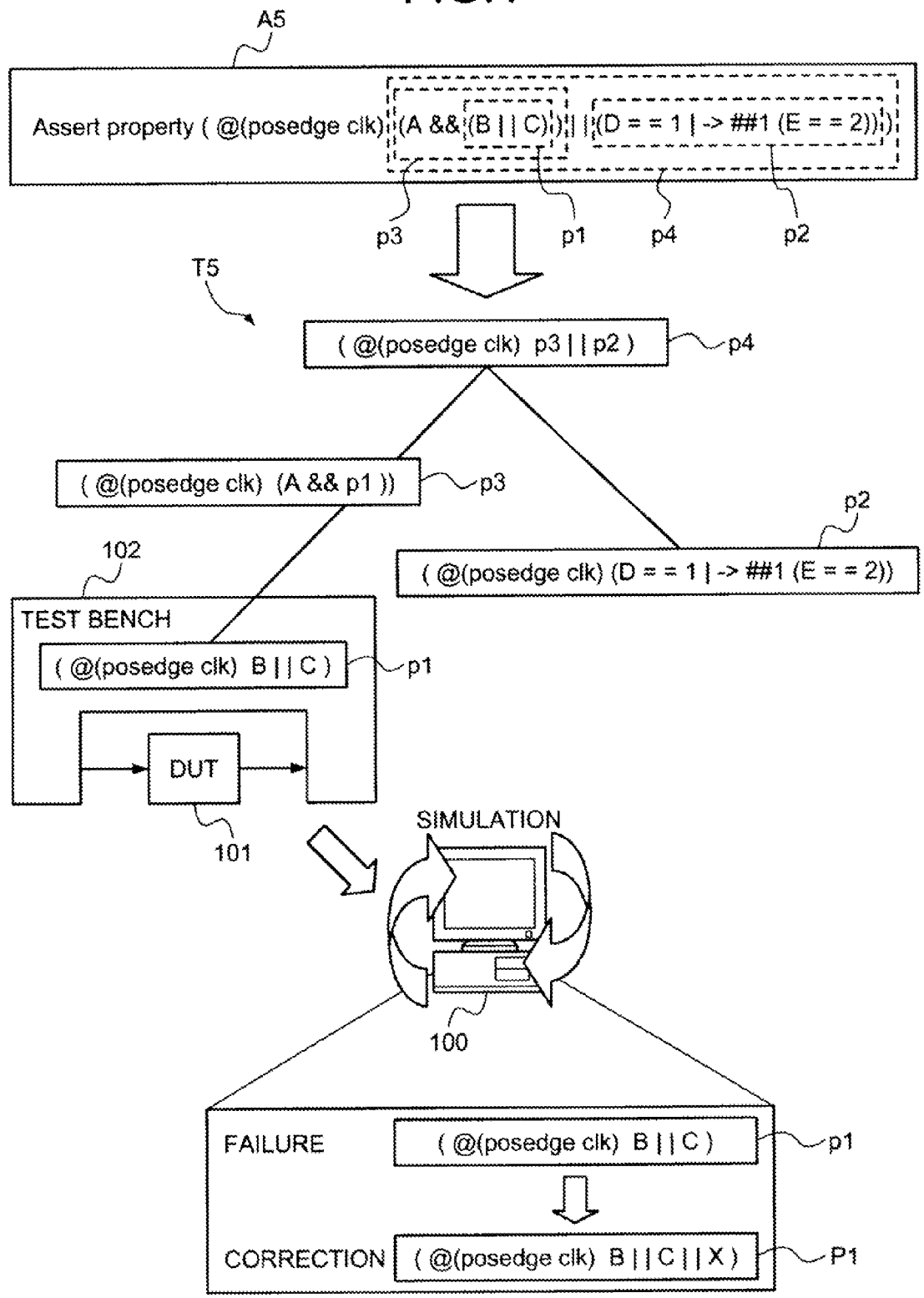
FIG. 1 is a schematic depicting an example of assertion correction according to an embodiment.

FIG. 1 is a schematic depicting an example of assertion correction according to the present embodiment. In FIG. 1, assertion A5 is an assertion that fails under simulation by the design information 101 of a circuit-under-test DUT. Assertion A5 is information formed by multiple properties p1 to p4 concatenated by logical OR (||) or logical AND (&&).

Therefore, the correcting apparatus 100 decomposes assertion A5 at the border of the logical OR and the logical AND. In FIG. 1, assertion A5 is decomposed into the properties p1 to p4. The properties p1 to p4 are tree-structured data T5 according to the logical structure of assertion A5.

The validity and failure of the properties p1 to p4 built in a test bench 102 (in FIG. 1, for example, p1) are determined by a simulation of the circuit-under-test DUT using the design information 101 thereof. For example, at the rising clock edge, if the bit values B, C of registers Rb, Rc are "0" and the bit value X of register Rx is "1", property p1 fails.

In this case, the correcting apparatus 100 corrects property p1 by appending "||X" to property p1. Therefore, when simulation is executed after the correction, if the bit values B, C of the registers Rb, Rc are "0" and the bit value X of the register Rx is "1" at the rising clock edge, the corrected property p1 becomes valid.

Figure 2:
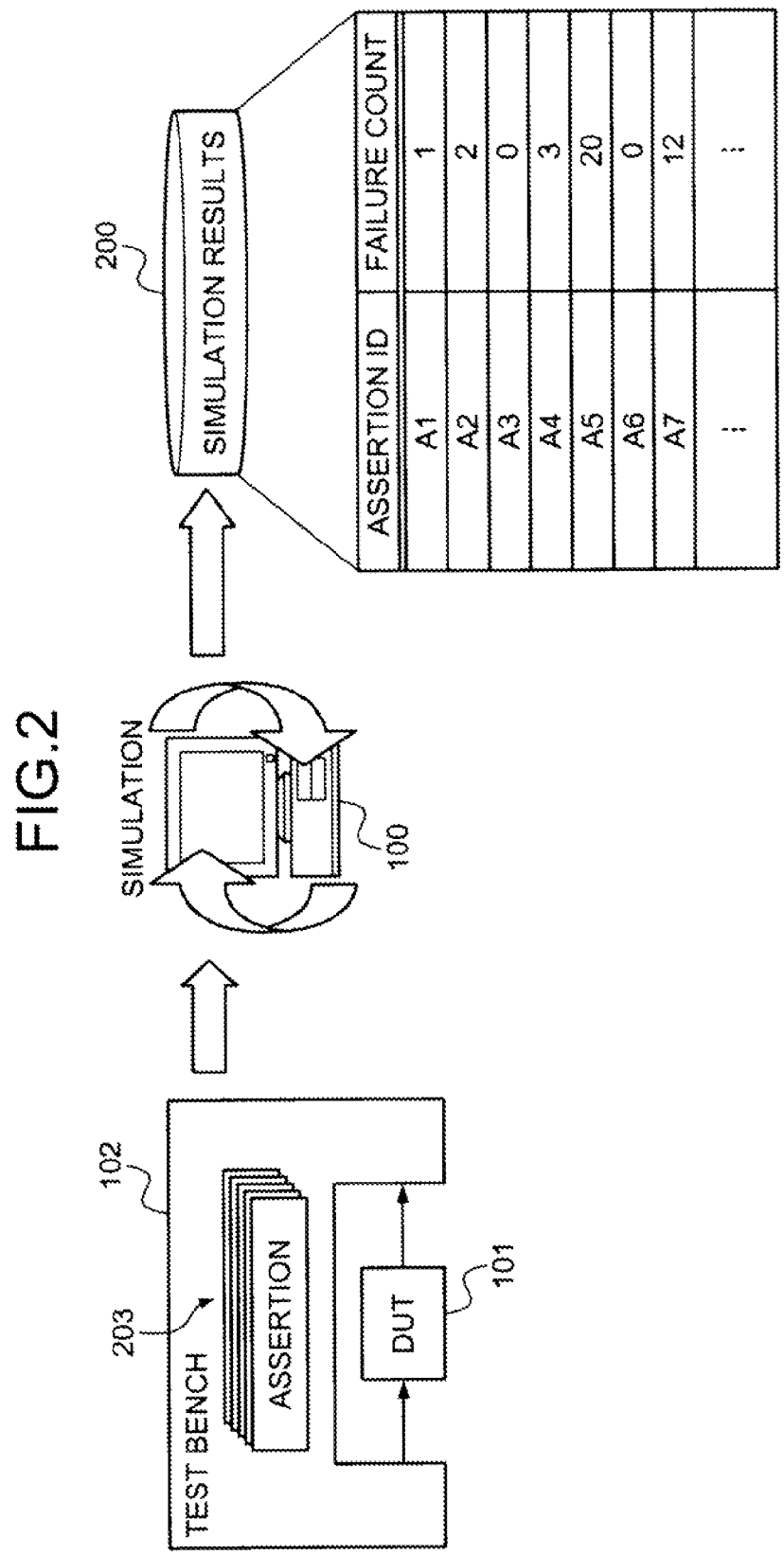
FIG. 2 is a schematic depicting an example of a narrowing down of correction subjects.

FIG. 2 is a schematic depicting an example of a narrowing down of correction subjects. In FIG. 2, before the assertion decomposition depicted in FIG. 1, the assertions to be subject to correction are narrowed down, whereby assertions having a high potential of having a latent error can be preferentially extracted.

For example, the correcting apparatus 100 obtains simulation results 200 by simulating the circuit-under-test DUT using the test bench 102 built from a group of assertions and the design information 101 of the circuit-under-test DUT. The simulation results 200 include an assertion ID and a failure count for each assertion. An assertion ID is an identifier code identifying an assertion. In the present example, for convenience, a code allocated to the assertions is assumed to be identifier code.

A failure count is the number of times an assertion is not valid during simulation and is counted during the simulation. If failure is caused by different factors, the failure count includes the failure count for each of the factors, mixed together. For example, the failure count for assertion A5 is 20, which means that for the properties p1 to p4, the total failure count is 20, whereas a breakdown according to property would yield differing failure counts.

For example, if the failure count for property p1 is 13, 7 for property p2, and 0 for properties p3 and p4, the verification engineer knows that correction concerning the properties p3 and p4 is not necessary. In this manner, by decomposing the assertions, properties requiring correction and properties not requiring correction can be identified.

Figure 3:
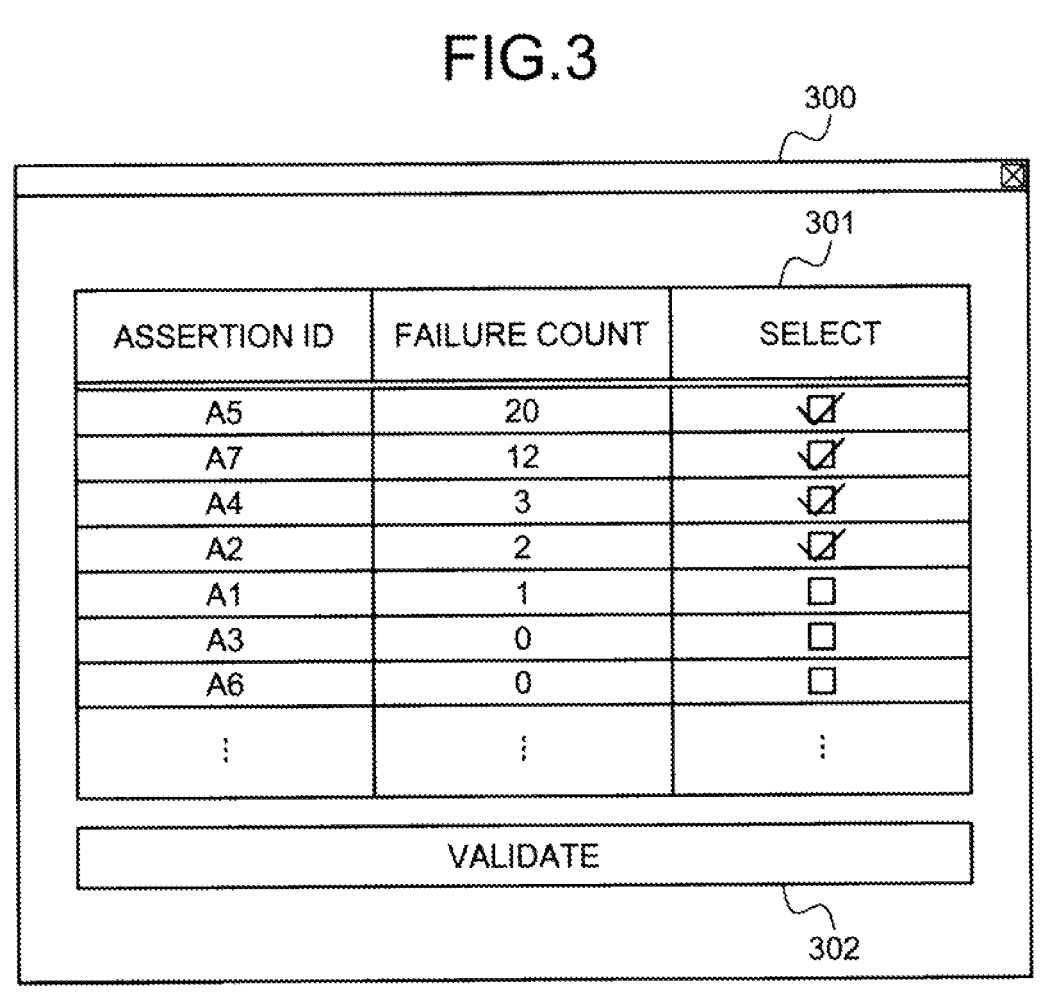

FIG. 3 is a schematic depicting an example of a selection screen for the simulation results 200. In FIG. 3, the simulation results 200 are displayed on a selection screen 300. For example, an assertion ID, a failure count, and a check box are displayed for each assertion. Assertions having higher failure counts, have a higher potential of having a latent error. Therefore, the verification engineer uses an input device such as a mouse to check the check box 301 of an assertion to be corrected and clicks a verification button 302 to set the selected assertion as a correction subject.

In the example depicted in FIG. 3, the assertions A5, A7, A4, and A2 are correction subjects. In FIGS. 2 and 3, although failure counts are recorded and displayed, configuration may be such that failure probability (=failure count/(valid count+failure count)) is recorded and displayed.

Figure 4:
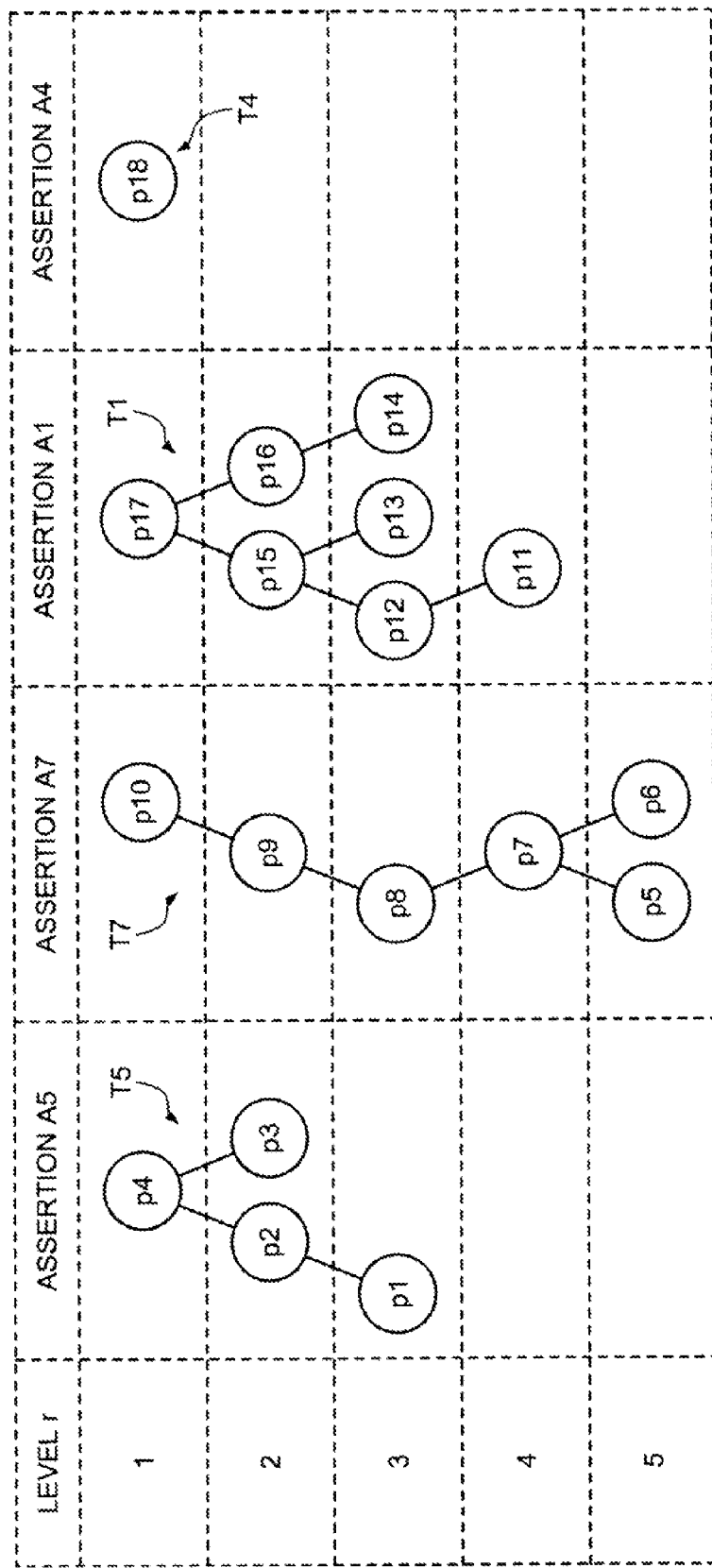
FIG. 4 is a schematic of tree-structured data.

FIG. 4 is a schematic of tree-structured data. As depicted in FIG. 1, tree-structured data is a structure concatenating related properties decomposed from an assertion according to the logical structure of the assertion. In FIG. 4, O are nodes of tree-structured data, representing properties. Properties are indicated by reference numerals in the Os. Tree-structured data is generated for each correction subject. The highest level of the tree-structured data is assumed to be the first level and the level number r increases at each subsequent lower level. In the example depicted in FIG. 4, the fifth level of assertion A7 is the lowest level.

FIG. 5 is a schematic of re-simulation results 500 of the circuit-under-test DUT re-simulated using the properties decomposed from the correction subject. In FIG. 5, a property ID, a failure count, and failure source are recorded for each property. A property ID is identifier code identifying a property. In the present example, for convenience, code allocated to a property is assumed to be identifier code. A failure count is the number of times a property is not valid during simulation and is counted during the simulation.

A failure source is a factor that causes a property to failure. For example, the failure source of property p1 is "X". In other words, where at least one of the bit values B, C of the registers Rb and Rc should be "1", both are "0" and the bit value X of the register RX is "X=1", consequently failure of the property is indicated.

The failure source of property p2 is "E==3". In other words, for property p2, where after one cycle, D=1 should be E==2, "E==3" results and consequently failure of the property is indicated.

The failure source of property p5 is "G==J". In other words, for property p5, where the variable/signal G should always be the same as the variable/signal H, "G==J" results and consequently, failure of the property is indicated.

Figure 6:
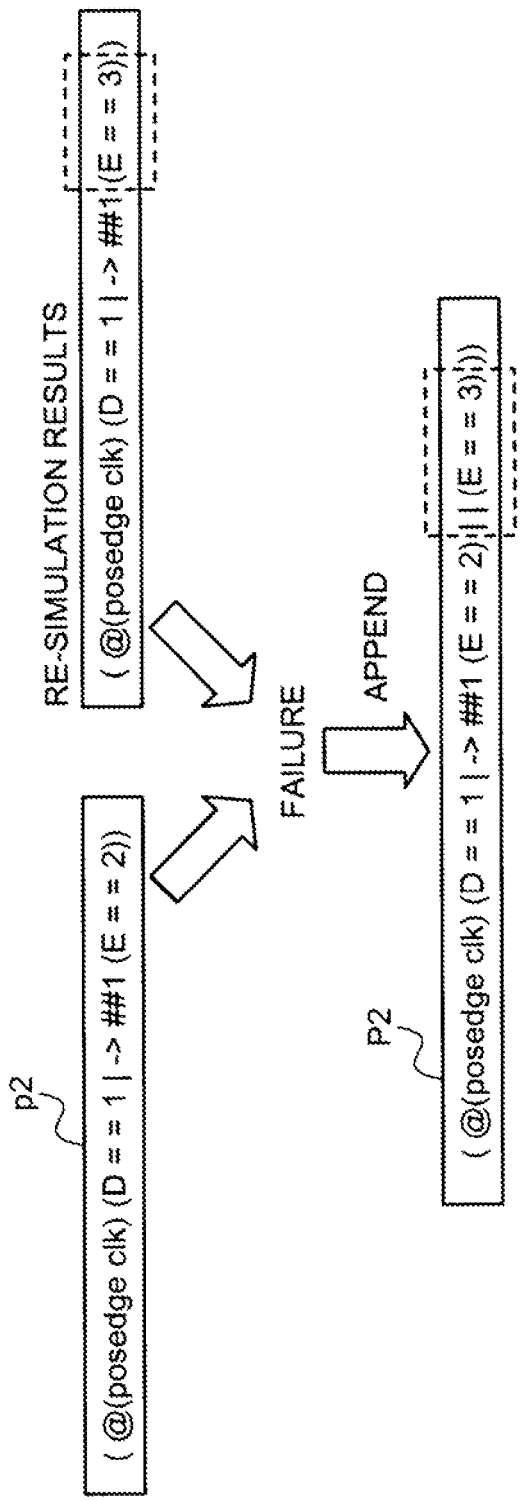
FIG. 6 is a schematic of a first example of property correction.
Figure 7:
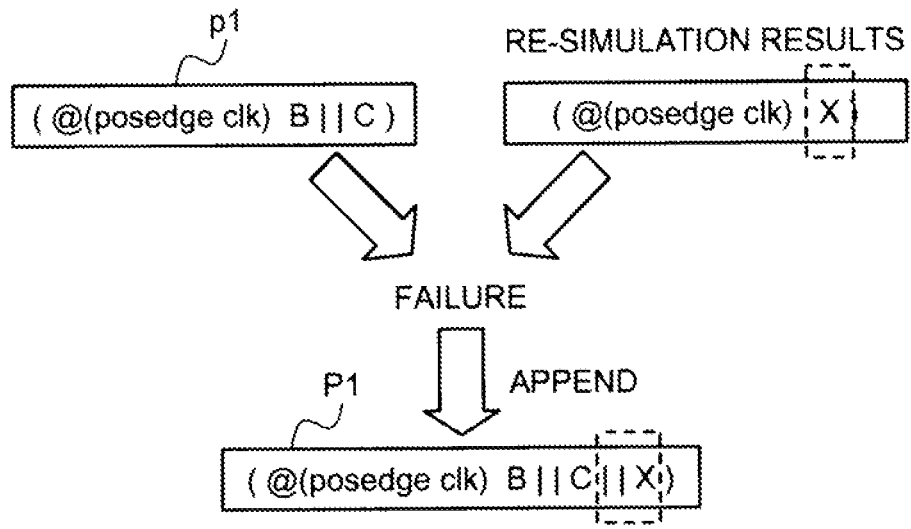
FIG. 7 is a schematic of a second example of property correction.
Figure 8:
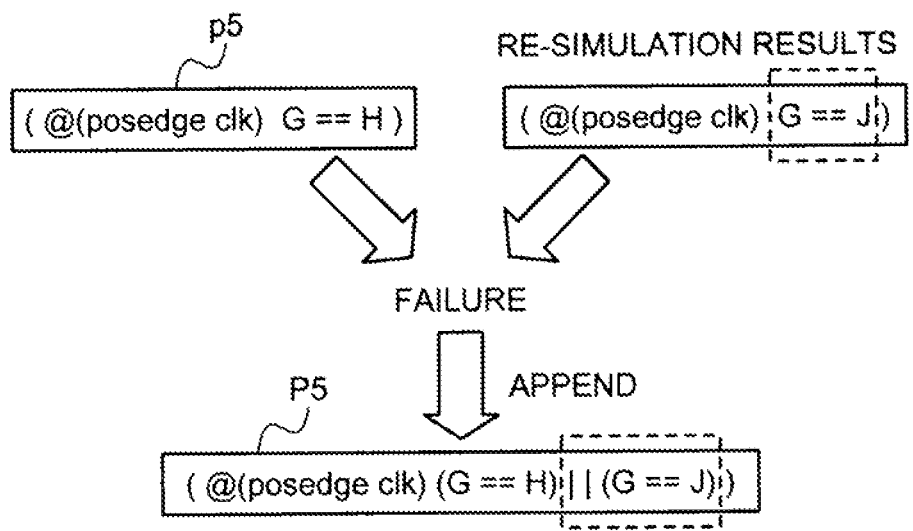
FIG. 8 is a schematic of a third example of property correction.

FIGS. 6 to 8 are schematics of examples of property correction. FIG. 6 depicts an example of correction of property p2. For property p2, where after one cycle, D=1 should be E==2, "E==3" occurs and consequently failure occurs. Therefore, the correcting apparatus 100 concatenates the failure source "E==3" to property p2 by logical OR, whereby property p2 becomes the corrected property p2. Therefore, during the next simulation, after one cycle, if D==1 becomes "E==2" or "E==3", the corrected property p2 becomes valid.

FIG. 7 depicts an example of correction of property p1. For property p1, where at least one of the bit values B, C of the registers Rb and Rc should be "1", both are "0" and the bit value X of register RX is "X=1", consequently failure occurs. Therefore, the correcting apparatus 100 concatenates the failure source "X" to property p1 by logical OR, whereby property p1 becomes the corrected property p1. Therefore, during the next simulation, if any one of the bit values B, C, X of the registers Rb, Rc, and Rx becomes "1", the corrected property p1 becomes valid.

FIG. 8 depicts an example of correction of property p5. For property p5, where variable/signal G should always be the same as variable/signal H, "G==J" occurs and consequently, failure occurs. Therefore, the correcting apparatus 100 concatenates the failure source "G==J" to property p5 by logical OR, whereby property p5 becomes the corrected property p5. Therefore, during the next simulation, if "G==H" or "G==J" occurs, the corrected property p5 becomes valid.

Figure 9:
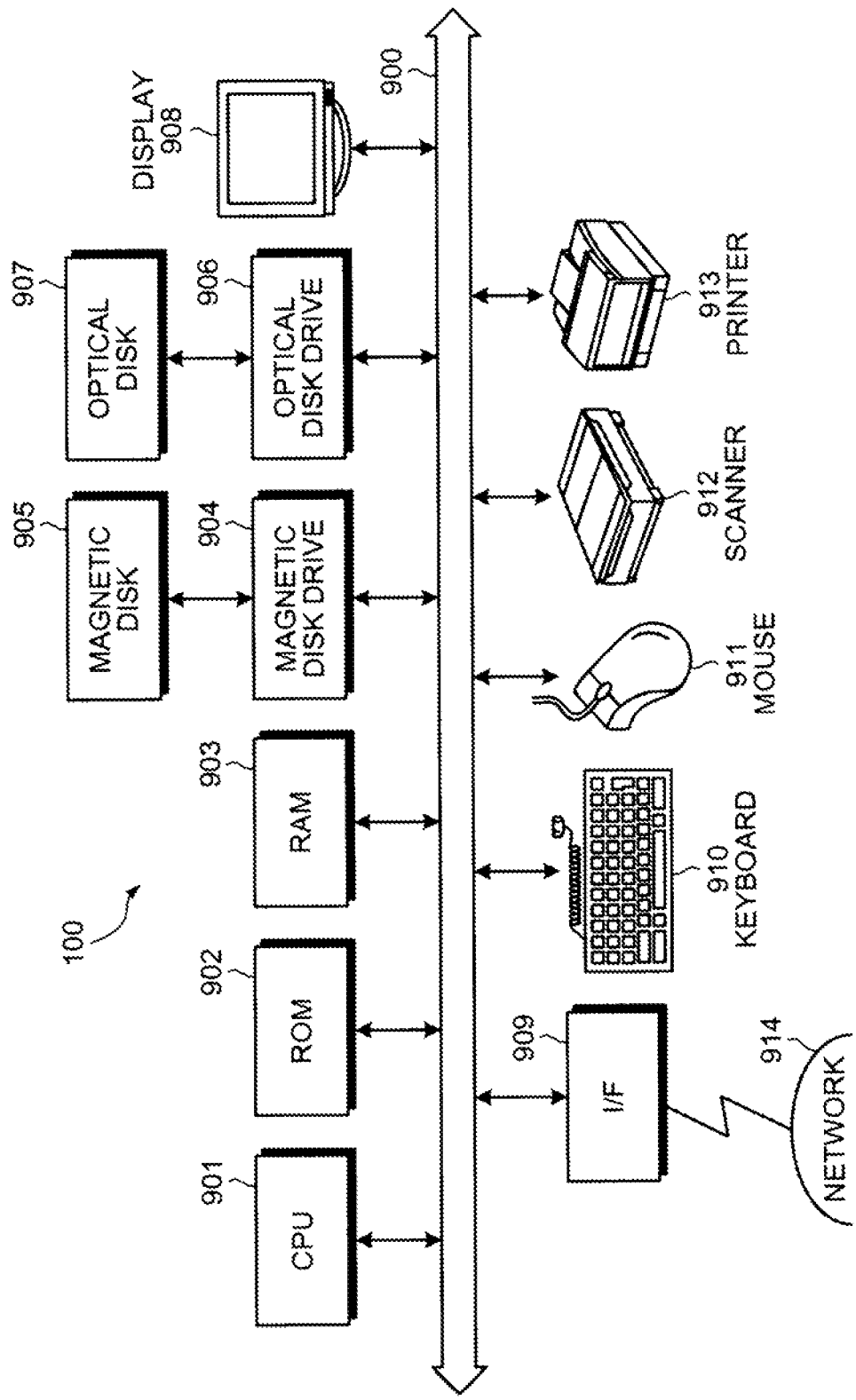
FIG. 9 is a block diagram of a hardware configuration of a correcting apparatus 100 according to the embodiment.

FIG. 9 is a block diagram of a hardware configuration of the correcting apparatus 100 according to the embodiment. In FIG. 9, the correcting apparatus 100 includes a central processing unit (CPU) 901, read-only memory (ROM) 902, random access memory (RAM) 903, a magnetic disk drive 904, a magnetic disk 905, an optical disk drive 906, an optical disk 907, a display 908, an interface (I/F) 909, a keyboard 910, a mouse 911, a scanner 912, and a printer 913, respectively connected through a bus 900.

The CPU 901 governs overall control of the correcting apparatus. The ROM 902 stores therein programs such as a boot program. The RAM 903 is used as a work area of the CPU 901. The magnetic disk drive 904, under the control of the CPU 901, controls the reading and writing of data with respect to the magnetic disk 905. The magnetic disk 905 stores therein data written under control of the magnetic disk drive 904.

The optical disk drive 906, under the control of the CPU 901, controls the reading and writing of data with respect to the optical disk 907. The optical disk 907 stores therein data written under control of the optical disk drive 906, the data being read by a computer.

The display 908 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 908.

The I/F 909 is connected to a network 914 such as a local area network (LAN), a wide area network (WAN), and the Internet through a communication line and is connected to other apparatuses through the network 914. The I/F 909 administers an internal interface with the network 914 and controls the input/output of data from/to external apparatuses.

The keyboard 910 includes, for example, keys for inputting letters, numerals, and various instructions and performs the input of data. Alternatively, a touch-panel-type input pad or numeric keypad, etc. may be adopted. The mouse 911 is used to move the cursor, select a region, or move and change the size of windows. A track ball or a joy stick may be adopted provided each respectively has a function similar to a pointing device.

The scanner 912 optically reads an image and takes in the image data into the correcting apparatus. The scanner 912 may have an optical character reader function as well. The printer 913 prints image data and text data. The printer 913 may be, for example, a laser printer or an ink jet printer.

Figure 10:
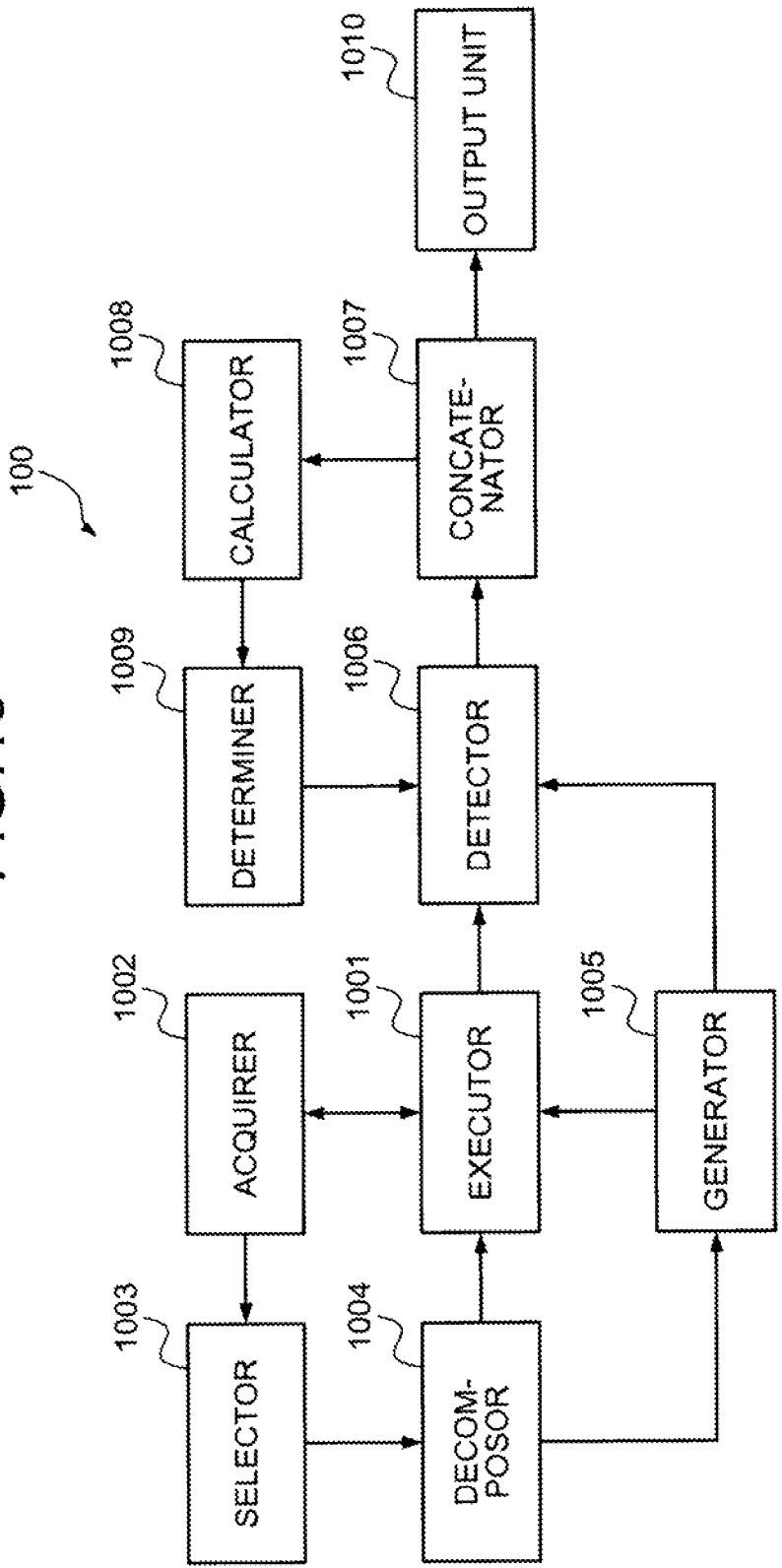
FIG. 10 is a block diagram of a functional configuration of the correcting apparatus 100.

FIG. 10 is a block diagram of a functional configuration of the correcting apparatus 100. The correcting apparatus 100 includes an executor 1001, an acquirer 1002, a selector 1003, a decomposer 1004, a generator 1005, a detector 1006, a concatenator 1007, a calculator 1008, a determiner 1009, and an output unit 1010. Functions of the executor 1001 to the output unit 1010 are, for example, are implemented by the I/F 909 or by executing, on the CPU 901, a program stored to a storage device such as the ROM 902, the RAM 903, the magnetic disk 905, and the optical disk 907 depicted in FIG. 9.

The executor 1001 executes simulations using the design information 101 of the circuit-under-test DUT. For example, the executor 1001 executes a simulation as depicted in FIG. 2. Further, during simulation, the executor 1001 determines whether each assertion is valid (successful) or fails. In the case of failure, the executor 1001 counts the number of failures for each assertion and as depicted in FIG. 2, stores the results to a storage device, as the simulation results 200.

The acquirer 1002 acquires the failure counts for each assertion, resulting from simulation of the circuit-under-test DUT. For example, the simulation results 200 depicted in FIG. 2 are stored to a storage device by the executor 1001 and from the simulation results 200, the acquirer 1002 reads out the failure counts for each assertion.

From among the assertions and based on the failure counts acquired by the acquirer 1002, the selector 1003 selects correction subjects. For example, based on the failure counts acquired by the acquirer 1002, the selection screen 300 depicted in FIG. 3 is displayed. Therefore, the verification engineer uses an input device such as a mouse to check the check box 301 of an assertion to be corrected and clicks the verification button 302, whereby the selector 1003 recognizes each assertion for which the check box 301 has been checked, to be a correction subject.

The decomposer 1004 decomposes each correction subject based on the logical structure thereof. A correction subject that is to be decomposed may be arbitrarily determined by the verification engineer or may be an assertion selected via the selector 1003 as a correction subject. The decomposer 1004 extracts, as properties, expressions concatenated by logical OR or by logical AND, as depicted in FIG. 1. According to correction subject, the extracted properties are stored to the storage device.

The generator 1005 generates tree-structured data of the properties obtained by the decomposer 1004. For example, the generator 1005 generates tree-structured data from inclusion relationships among the properties obtained for each correction subject. For example, since properties p2 and p3 are included in property p4, properties p2 and p3 are correlated with property p4 as lower level properties thereof. Since property p3 includes property p1, property p1 is correlated with property p3 as a lower level property thereof. Consequently, tree-structured data such as that depicted in FIG. 4 is generated for each property to be corrected.

Further, as depicted in FIG. 1, the executor 1001 uses the properties to simulate (re-simulate) the circuit-under-test DUT. During the re-simulation, failure counts are counted for each property to detect failure sources. Consequently, re-simulation results 500 such as those depicted in FIG. 5 are obtained. The re-simulation results 500 are stored to the storage device.

By the simulation of the circuit-under-test DUT, the detector 1006 detects properties that have failed from among the properties decomposed from the correction subject by the decomposer 1004. For example, from the re-simulation results 500, the detector 1006 detects properties that have failed a given number of times (e.g., 1) or more, as a property to be corrected.

The detector 1006 begins detecting from the lowest level property among the properties configuring the tree-structured data generated by the generator 1005. For example, in the example depicted in FIG. 4, properties p5 and p6 of the fifth level are detected, followed by properties p7 and p11 of the fourth level, followed by properties p1, p8, p12 to p14 at the third level. In this manner, progressing upward by level, the detector 1006 ultimately detects properties p4, p10, p17, and p18 at the first level. The detector 1006 further detects from the re-simulation results 500, the failure sources of the properties to be corrected.

The concatenator 1007 concatenates failure sources to the failed properties detected by the detector 1006, the failure sources are concatenated by logical OR. The concatenator 1007, for example, concatenates by logical OR as depicted in FIGS. 6 to 8.

Each time the concatenator 1007 performs concatenation to a property of a correction subject, the calculator 1008, for each correction subject, sums the failure counts of the properties before the concatenation. For example, taking the properties p1 to p4 of assertion A5 (correction subject) as an example, the failure count for assertion A5 is 20 (refer to FIG. 2), the failure count for property p1 is 13, the failure count for property p2 is 7, and the failure counts for properties p3 and p4 are respectively 0 (refer to FIG. 5).

The initial cumulative failure count is 0. Since the detector 1006 sequentially detects properties to be corrected from the fifth level, which is the lowest level, with respect to the tree-structured data T5 of assertion A5, property p1 at the third level is detected first and the concatenator 1007 performs concatenation. Here, since the failure count for property p1 is 13, calculation of the cumulative failure count yields 0+13=13. Subsequently, property p2 at the second level is detected and the concatenator 1007 performs concatenation. Here, since the failure count for property p2 is 7, calculation of the cumulative failure count yields 13+7=20.

The determiner 1009, for each correction subject, determines whether the failure count calculated by the calculator 1008 has reached the failure count of the correction subject. For example, at each calculation of the cumulative failure count, the determiner 1009 determines whether the failure count of the correction subject has been reached.

For instance, in the example above, when property p2 of the second level is detected and the cumulative failure count is 13+7=20, the determiner 1009 determines that the failure count "20" of the (correction subject) assertion A5 has been reached. In this case, concerning the tree-structured data T5, the detector 1006 does not perform further failure detection with respect to properties p3 and p4.

In other words, even if detection processing is executed, properties that fail will not be obtained and therefore, the tree-structured data T5 is excluded from the detection subjects. For example, a detection-exclusion flag may be set, the tree-structured data T5 may be deleted, etc. As a result, increased speed of the correction processing can be facilitated.

The output unit 1010 outputs the properties concatenated by the concatenator 1007. For example, the output unit 1010 outputs the concatenated properties, i.e., the corrected properties. The output unit 1010 further outputs the properties that did not require correction. These properties are collectively called correction properties. The correction properties are output to the display 908 for display; are output to the printer 913 for print out; are output to the I/F 909 for transmission to an external device; and/or are output to the storage device for storage.

Figure 11:
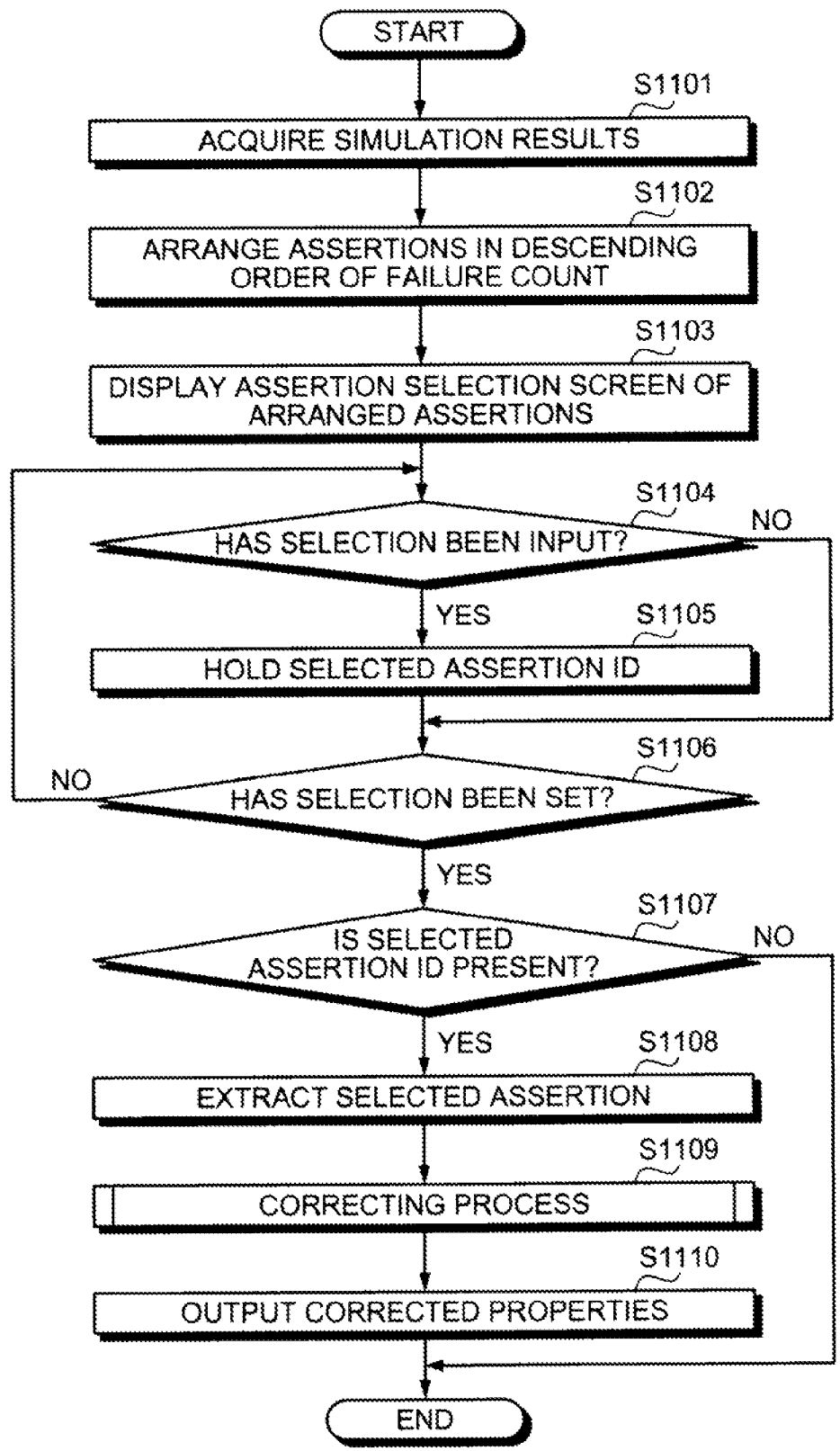
FIG. 11 is a flowchart of a procedure of a correcting process by the correcting apparatus 100.

FIG. 11 is a flowchart of a procedure of a correcting process by the correcting apparatus 100. The correcting apparatus 100 acquires the simulation results 200 such as those depicted in FIG. 2 (step S1101) and arranges the assertions in descending order of failure count (step S1102). The correcting apparatus 100 displays on the display 908, the selection screen 300 depicting the assertions after arrangement, such as that depicted in FIG. 3 (step S1103).

If selection has been input via the selector 1003 (step S1104: YES), the correcting apparatus 100 holds the selected assertion ID (step S1105), and proceeds to step S1106. On the other hand, if selection has not been input (step S1104: NO), the correcting apparatus 100 proceeds to step S1106.

At step S1106, the correcting apparatus 100 determines whether a selection has been set by a manipulation of the verification button 302 on the selection screen 300 (step S1106). If no selection has been set (step S1106: NO), the correcting apparatus 100 returns step S1104. On the other hand, if a selection has been set (step S1106: YES), the correcting apparatus 100 determines whether a selected assertion ID is present (step S1107).

If no selected assertion ID is present (step S1107: NO), the verification button 302 has been manipulated without the selection of any assertion, ending the process. On the other hand, if a selected assertion ID is present (step S1107: YES), the selected assertion ID is used as clue to extract the selected assertion from the simulation results 200 (step S1108). Since the extracted assertion is a correction subject, the correcting apparatus 100 executes correction processing for the correction subject (step S1109). Details of the correction processing (step S1109) are described with reference to FIG. 12.

After the correction processing (step S1109), the correcting apparatus 100 outputs the corrected properties by the output unit 1010 (step S1110), ending the process. The verification engineer may correct the corrected properties as necessary using an input device such as a mouse or keyboard.

Figure 12:
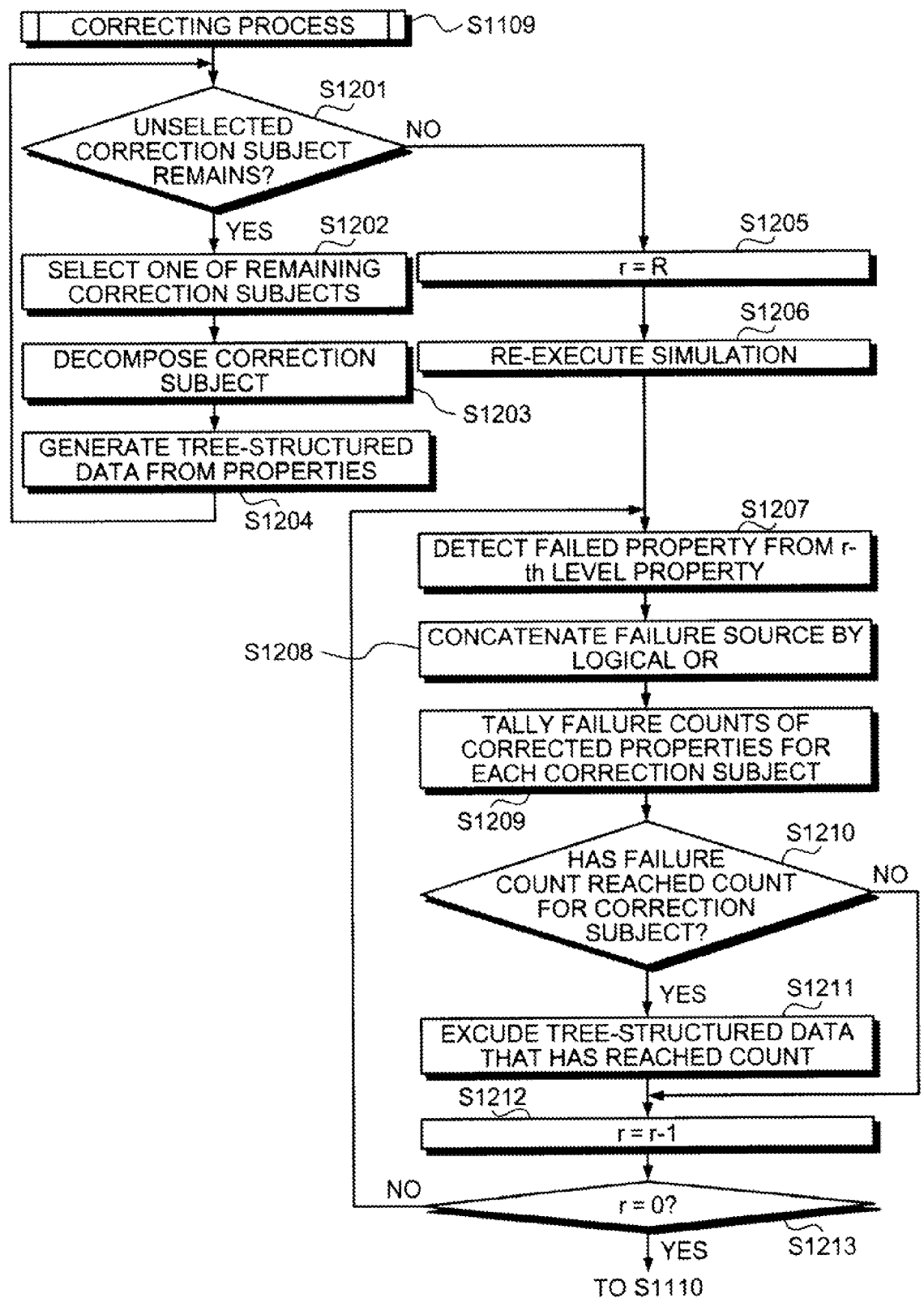
FIG. 12 is a flowchart depicting an example of details of a correcting process (step S1109) depicted in FIG. 11.

FIG. 12 is a flowchart depicting an example of details of the correcting process (step S1109) depicted in FIG. 11. The correcting apparatus 100 determines whether a correction subject that has yet to be selected remains (step S1201). If a correction subject remains (step S1201: YES), the correcting apparatus 100 selects a correction subject via the selector 1003 (step S1202) and decomposes the correction subject via the decomposer 1004 (step S1203). The correcting apparatus 100, via the generator 1005, uses the decomposed properties to generate tree-structured data of the correction subject (step S1204), and returns to step S1201.

At step S1201, if no correction subject remains unselected (step S1201: NO), the correcting apparatus 100 sets the level number r as r=R (step S1205). R is the lowest level in the generated tree-structured data. In the example depicted in FIG. 4, R=5. Next, the correcting apparatus 100, via the executor 1001, uses the properties (tree-structured data) to re-simulate the circuit-under-test DUT (step S1206).

The correcting apparatus 100, via the detector 1006, detects from the properties at the r-th level of the tree-structured data, a property that fails (step S1207). Next, as depicted in FIGS. 6 to 8, the correcting apparatus 100, via the concatenator 1007, concatenates the source of failure to the failed property by logical OR (step S1208).

The correcting apparatus 100, via the calculator 1008, tallies the failure counts of the corrected properties, for each correction subject (step S1209). Subsequently, the correcting apparatus 100, via the determiner 1009, determines for each correction subject, whether the failure count thereof has been reached (step S1210). For correction subjects for which the failure count has not been reached (step S1210: NO), the correcting apparatus 100 proceeds to step S1212. For correction subjects for which the failure count has been reached (step S1210: YES), the correcting apparatus 100 sets the tree-structured data thereof to be excluded from the correction subjects (step S1211), and proceeds to step S1212. As a result, increased speed of subsequent correction processing can be facilitated.

At step S1212, the correcting apparatus 100 decrements the level number r (step S1212) and determines whether r=0 (step S1213). If r=0 is not true (step S1213: NO), the correcting apparatus 100 returns to step S1207. On the other hand, if r=0 is true (step S1213: YES), the correcting apparatus 100 ends the correcting process (step S1109) and proceeds to step S1110. In the correcting process (step S1109), steps S1209 to S1211 may be omitted.

Thus, according to the embodiment, an assertion that has failed can be decomposed into properties and to each property that fails, the failure source can be concatenated by logical OR, whereby automation of the correcting process can be facilitated. Further, since the correcting process is performed for each property and not according to assertion, without manually searching for parts requiring correction, the parts can be automatically pinpointed. Therefore, increased speed of the correcting process can be facilitated. Furthermore, by detecting properties that fail from the lowest level in tree-structured data, the property primarily causing the failure can be quickly pinpointed.

Further, if the failure count reaches the failure count of the correction subject, properties that fail do not exist beyond this point in the tree-structured data of the correction subject and therefore, the detection process is skipped for such tree-structured data, whereby increased speed of the correcting process can be facilitated.

Thus, according to the embodiment, even if the specifications are not sufficiently understood or are misunderstood, properties that should be corrected can be automatically pinpointed and an appropriate correcting process can be executed with respect to such properties. Therefore, the workload of the verification engineer to analyze the specifications or to reconfirm the specification together with the design engineer and then, correct the assertion can be decreased, enabling the assertion correction work time to be shortened. As a result, the efficiency of the assertion correcting process work can be improved.

The correcting method described in the present embodiment may be implemented by executing a prepared program on a computer such as a personal computer and a workstation. The program is stored on a computer-readable medium such as a hard disk, a flexible disk, a CD-ROM, an MO, and a DVD, read out from the recording medium, and executed by the computer. The program may be distributed through a network such as the Internet. However, the computer-readable medium does not include a transitory medium such as a propagation signal.

According to one aspect of the invention, assertion correction work efficiency can be facilitated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable medium storing therein a correcting program that causes a computer to execute a process, the process comprising:
   decomposing a correction subject assertion, based on a logical structure of the correction subject assertion;
   detecting by simulation of a circuit-under-test and from among properties obtained by decomposing the correction subject assertion, a property that has failed;
   concatenating a failure source to the detected property by calculating a logical OR thereof; and
   outputting the concatenated property.

2. The non-transitory computer-readable medium according to claim 1, the process further comprising:
   generating tree-structured data of the properties, wherein the detecting begins from the lowest level property, among the properties configuring the generated tree-structured data.

3. The non-transitory computer-readable medium according to claim 1, the process further comprising:
   acquiring by simulation of the circuit-under-test and for each assertion, a failure count; and
   selecting based on the acquired failure counts and from among the assertions, the correction subject assertion, wherein
   the decomposing decomposes the selected correction subject assertion, based on the logical structure of the correction subject assertion.

4. The non-transitory computer-readable medium according to claim 3, the process further comprising:
   calculating for each correction subject assertion and at each concatenation at the concatenating, a sum of the failure counts concerning the properties before the concatenation; and
   determining for each correction subject assertion, whether the sum of the failure counts has reached the failure count of the correction subject, wherein
   the tree-structured data of a correction subject assertion for which the sum has been determined to have reached the failure count is not subject to the detecting.

5. A correcting apparatus comprising:
   a decomposer that decomposes a correction subject assertion, based on a logical structure of the correction subject assertion;
   a detector that by simulation of a circuit-under-test and from among properties obtained by decomposing the correction subject assertion, detects a property that has failed;
   a concatenator that concatenates a failure source to the detected property by calculating a logical OR thereof; and
   an output unit that outputs the concatenated property.

6. A correcting method executed by a computer, the correcting method comprising:
   decomposing, by the computer, a correction subject assertion, based on a logical structure of the correction subject assertion;
   detecting, by the computer, by simulation of a circuit-under-test and from among properties obtained by decomposing the correction subject assertion, a property that has failed;
   concatenating a failure source to the detected property by calculating a logical OR thereof; and
   outputting the concatenated property.

* * * * *